United States Patent
Sell

(10) Patent No.: US 10,651,310 B2
(45) Date of Patent: *May 12, 2020

(54) SEMICONDUCTOR DEVICE HAVING A NECKED SEMICONDUCTOR BODY AND METHOD OF FORMING SEMICONDUCTOR BODIES OF VARYING WIDTH

(71) Applicant: Intel Corporation, Santa Clara, CA (US)

(72) Inventor: Bernhard Sell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/393,290

(22) Filed: Apr. 24, 2019

(65) Prior Publication Data

US 2019/0319121 A1    Oct. 17, 2019

Related U.S. Application Data

(60) Continuation of application No. 15/275,072, filed on Sep. 23, 2016, now Pat. No. 10,319,843, which is a
(Continued)

(51) Int. Cl.
*H01L 29/78* (2006.01)
*H01L 27/108* (2006.01)
(Continued)

(52) U.S. Cl.
CPC .... *H01L 29/7853* (2013.01); *H01L 21/02532* (2013.01); *H01L 21/3083* (2013.01);
(Continued)

(58) Field of Classification Search
CPC ............. H01L 27/0886; H01L 27/0924; H01L 27/10879; H01L 27/1211; H01L 29/41791;
(Continued)

(56) References Cited

U.S. PATENT DOCUMENTS 6,413,802 B1   7/2002 Hu et al.
6,583,469 B1   6/2003 Fried et al.
(Continued)

FOREIGN PATENT DOCUMENTS

CN          1311525 C      4/2007
KR       20060054420       5/2006
(Continued)

OTHER PUBLICATIONS

Office Action for Chinese Patent Application No. 201180076423.6, dated Nov. 28, 2016, 7 pgs.
(Continued)

*Primary Examiner* — Eduardo A Rodela
(74) *Attorney, Agent, or Firm* — Schwabe, Williamson & Wyatt, P.C.

(57) ABSTRACT

Semiconductor devices having necked semiconductor bodies and methods of forming semiconductor bodies of varying width are described. For example, a semiconductor device includes a semiconductor body disposed above a substrate. A gate electrode stack is disposed over a portion of the semiconductor body to define a channel region in the semiconductor body under the gate electrode stack. Source and drain regions are defined in the semiconductor body on either side of the gate electrode stack. Sidewall spacers are disposed adjacent to the gate electrode stack and over only a portion of the source and drain regions. The portion of the source and drain regions under the sidewall spacers has a height and a width greater than a height and a width of the channel region of the semiconductor body.

24 Claims, 8 Drawing Sheets

Related U.S. Application Data continuation of application No. 14/569,166, filed on Dec. 12, 2014, now Pat. No. 9,711,410, which is a division of application No. 13/995,634, filed as application No. PCT/US2011/066991 on Dec. 22, 2011, now Pat. No. 8,941,214.

(51) Int. Cl.

| | | |
|---|---|---|
| H01L 29/786 | (2006.01) | |
| H01L 27/088 | (2006.01) | |
| H01L 29/417 | (2006.01) | |
| H01L 29/66 | (2006.01) | |
| H01L 27/12 | (2006.01) | |
| H01L 27/092 | (2006.01) | |
| H01L 29/06 | (2006.01) | |
| H01L 21/02 | (2006.01) | |
| H01L 21/306 | (2006.01) | |
| H01L 21/308 | (2006.01) | |
| H01L 21/8234 | (2006.01) | |
| H01L 29/16 | (2006.01) | |
| H01L 29/08 | (2006.01) | |
| H01L 29/10 | (2006.01) | |
| H01L 29/165 | (2006.01) | |
| H01L 29/49 | (2006.01) | |
| H01L 29/51 | (2006.01) | |

(52) U.S. Cl.
CPC .......... *H01L 21/30604* (2013.01); *H01L 21/823412* (2013.01); *H01L 21/823431* (2013.01); *H01L 27/0886* (2013.01); *H01L 27/0924* (2013.01); *H01L 27/10826* (2013.01); *H01L 27/10879* (2013.01); *H01L 27/1211* (2013.01); *H01L 29/0657* (2013.01); *H01L 29/0847* (2013.01); *H01L 29/1037* (2013.01); *H01L 29/16* (2013.01); *H01L 29/165* (2013.01); *H01L 29/41791* (2013.01); *H01L 29/4966* (2013.01); *H01L 29/513* (2013.01); *H01L 29/518* (2013.01); *H01L 29/6656* (2013.01); *H01L 29/6681* (2013.01); *H01L 29/66545* (2013.01); *H01L 29/66636* (2013.01); *H01L 29/66772* (2013.01); *H01L 29/66795* (2013.01); *H01L 29/66818* (2013.01); *H01L 29/785* (2013.01); *H01L 29/786* (2013.01); *H01L 29/7851* (2013.01); *H01L 29/7854* (2013.01); *H01L 29/7856* (2013.01)

(58) Field of Classification Search
CPC ............. H01L 29/66795; H01L 29/785; H01L 29/7853; H01L 29/7856; H01L 29/786; H01L 2924/13067

See application file for complete search history.

(56) References Cited

U.S. PATENT DOCUMENTS

| | | | |
|---|---|---|---|
| 6,642,090 B1 | 11/2003 | Fried et al. | |
| 6,897,098 B2 | 5/2005 | Hareland et al. | |
| 7,029,958 B2 | 4/2006 | Tabery et al. | |
| 7,208,356 B2 | 4/2007 | Cho et al. | |
| 7,368,354 B2* | 5/2008 | Anderson | H01L 21/82382 257/E21.014 |
| 7,402,862 B2* | 7/2008 | Choi | H01L 29/4232 257/314 |
| 7,851,276 B2 | 12/2010 | Yang | |
| 7,858,481 B2 | 12/2010 | Brask et al. | |
| 7,902,035 B2* | 3/2011 | Yu | H01L 29/7851 257/E21.035 |
| 8,022,487 B2 | 9/2011 | Pillarisetty et al. | |
| 8,193,567 B2 | 6/2012 | Kavalieros | |
| 8,354,719 B2* | 1/2013 | Choi | H01L 21/76229 257/347 |
| 8,884,298 B2* | 11/2014 | Maeda | H01L 29/045 257/66 |
| 8,941,214 B2 | 1/2015 | Sell | |
| 9,741,809 B2 | 8/2017 | Shah | |
| 2003/0113970 A1 | 6/2003 | Fried | |
| 2004/0075122 A1 | 4/2004 | Lin et al. | |
| 2005/0026333 A1 | 2/2005 | Hareland et al. | |
| 2005/0104096 A1* | 5/2005 | Lee | H01L 21/82384 257/288 |
| 2005/0167750 A1 | 8/2005 | Yang et al. | |
| 2005/0253193 A1* | 11/2005 | Chen | H01L 29/665 257/347 |
| 2005/0253194 A1 | 11/2005 | Yang | |
| 2005/0263821 A1 | 12/2005 | Cho et al. | |
| 2006/0172497 A1 | 8/2006 | Hareland | |
| 2006/0237777 A1 | 10/2006 | Choi et al. | |
| 2007/0001173 A1 | 1/2007 | Brask et al. | |
| 2007/0057325 A1* | 3/2007 | Hsu | H01L 29/66795 257/347 |
| 2007/0069293 A1 | 3/2007 | Kavalieros et al. | |
| 2007/0152266 A1 | 7/2007 | Doyle et al. | |
| 2008/0067613 A1 | 3/2008 | Anderson et al. | |
| 2008/0111163 A1 | 5/2008 | Russ et al. | |
| 2008/0230852 A1 | 9/2008 | Yu | |
| 2008/0242010 A1 | 10/2008 | Rhee et al. | |
| 2011/0027948 A1 | 2/2011 | Ren et al. | |
| 2011/0147842 A1 | 6/2011 | Cappellani et al. | |
| 2011/0272763 A1* | 11/2011 | Sasaki | H01L 29/66803 257/347 |
| 2011/0291196 A1 | 12/2011 | Wei et al. | |
| 2013/0346978 A1* | 12/2013 | Jiang | G06F 9/45533 718/1 |
| 2014/0151761 A1* | 6/2014 | Hsieh | H01L 29/66545 257/288 |

FOREIGN PATENT DOCUMENTS

| | | |
|---|---|---|
| TW | 200635044 | 10/2006 |
| TW | 200721305 | 6/2007 |
| TW | 201137985 | 11/2011 |

OTHER PUBLICATIONS

International Search Report and Written Opinion for PCT Patent Application No. PCT/US2011/066991 dated Sep. 7, 2012, 9 pgs.
International Preliminary Report on Patentability from PCT/US2011/06691 dated Jul. 3, 2014, 6 pgs.
Office Action from Taiwan Patent Application No. 101146193 dated Nov. 26, 2014, 7 pgs.
Office Action and Search Report for Taiwanese Patent Application No. 104126378, dated Jun. 21, 2016, 9 pgs.
Office Action for Chinese Patent Application No. 201180076423.6, dated May 3, 2016, 14 pgs.
Notice of Allowance for Taiwan Patent Application No. 105135061 dated Oct. 10, 2017, 4 pgs., no translation.
Office Action for Taiwan Patent Application No. 106139960 dated Jun. 4, 2018, 10 pgs., with English Translation.
Office Action for Taiwan Patent Application No. 106139960 dated Feb. 14, 2019, 10 pgs.
Notice of Allowance for Chinese Patent Application No. 201180076423.6, dated Aug. 2, 2017, 5 pgs.
Notice of Allowance from Taiwan Patent Application No. 101146193 dated Jul. 17, 2015, 2 pgs.
Notice of Allowance for Taiwanese Patent Application No. 104126378, dated Aug. 29, 2016, 2 pgs.
Office Action for German Patent Application No. 112011105996.5, dated Aug. 19, 2019, 16 pgs.
Office Action for Taiwan Patent Application No. 106139960 dated Sep. 3, 2019, 3 pgs.

(56) References Cited

OTHER PUBLICATIONS

Office Action from Chinese Patent Application No. 201710116832.3, dated Jan. 2 2020, 5 pages.

* cited by examiner

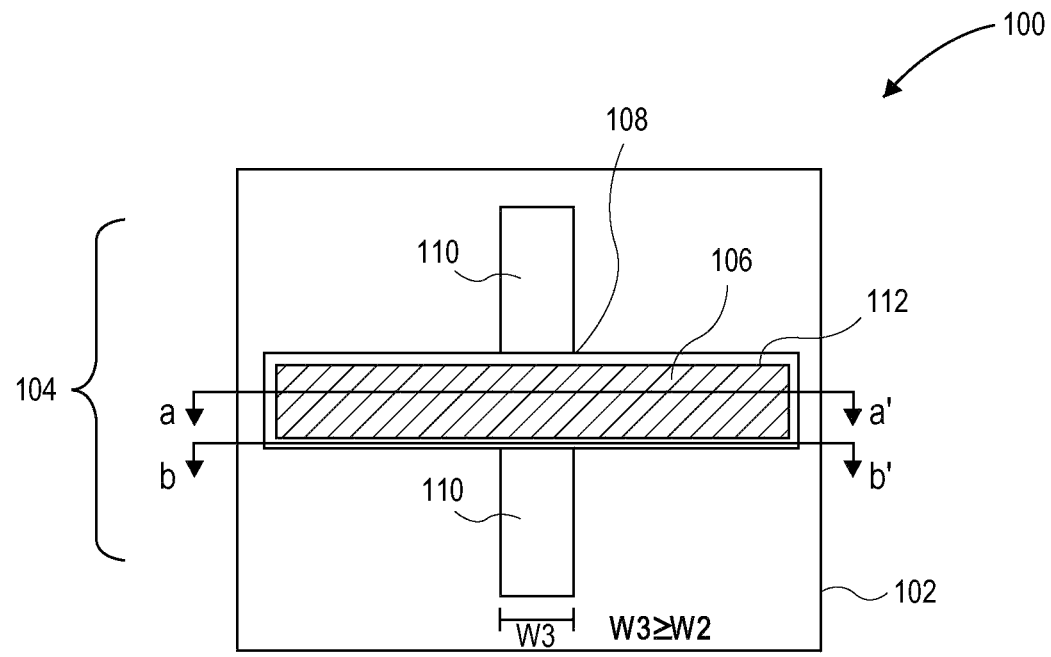
FIG. 1A
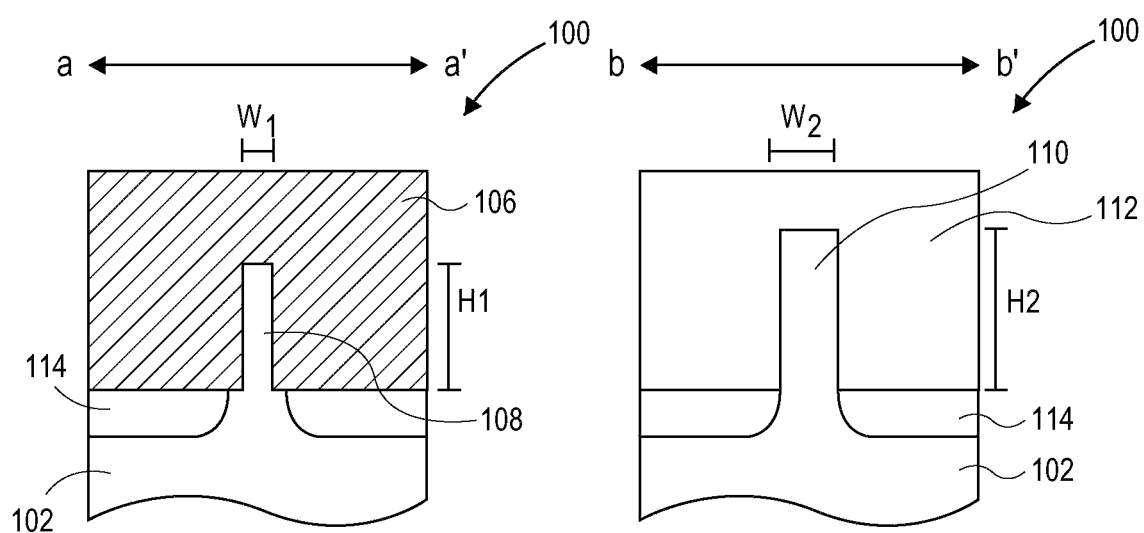
FIG. 1B  FIG. 1C

SEMICONDUCTOR DEVICE HAVING A NECKED SEMICONDUCTOR BODY AND METHOD OF FORMING SEMICONDUCTOR BODIES OF VARYING WIDTH

CROSS-REFERENCE TO RELATED APPLICATIONS

This application is a continuation of U.S. patent application Ser. No. 15/275,072, filed on Sep. 23, 2016, which is a continuation of U.S. patent application Ser. No. 14/569,166, filed on Dec. 12, 2014, now U.S. Pat. No. 9,711,410, issued on Jul. 18, 2017, which is a divisional of U.S. patent application Ser. No. 13/995,634, filed on Jun. 19, 2013, now U.S. Pat. No. 8,941,214, issued on Jan. 27, 2015, which is a U.S. National Phase application under 35 U.S.C. § 371 of International Application No. PCT/US2011/066991, filed on Dec. 22, 2011, the entire contents of which are hereby incorporated by reference herein.

TECHNICAL FIELD

Embodiments of the invention are in the field of semiconductor devices and processing and, in particular, semiconductor devices having necked semiconductor bodies and methods of forming semiconductor bodies of varying width.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as fin-FET and tri-gate transistors, have become more prevalent as device dimensions continue to scale down. In conventional processes, fin-FET and tri-gate transistors are generally fabricated on either bulk silicon substrates or silicon-on-insulator substrates. In some instances, bulk silicon substrates are preferred due to their lower cost and because they may enable a less complicated fin-FET and tri-gate fabrication process. In other instances, silicon-on-insulator substrates are preferred because of the improved short-channel behavior of fin-FET and tri-gate transistors.

Scaling multi-gate transistors has not been without consequence, however. As the dimensions of these fundamental building blocks of microelectronic circuitry are reduced and as the sheer number of fundamental building blocks fabricated in a given region is increased, the constraints on the external resistance ($R_{ext}$) during performance of such devices have become overwhelming. Many different techniques have been attempted to improve $R_{ext}$ of transistors including improved contact metals, increased activation of dopant and lowered barriers between the semiconductor and contact metal. However, significant improvements are still needed in the area of $R_{ext}$ reduction.

SUMMARY

Embodiments of the present invention include semiconductor devices having necked semiconductor bodies and methods of forming semiconductor bodies of varying width.

In an embodiment, a semiconductor device includes a semiconductor body disposed above a substrate. A gate electrode stack is disposed over a portion of the semiconductor body to define a channel region in the semiconductor body under the gate electrode stack. Source and drain regions are defined in the semiconductor body on either side of the gate electrode stack. Sidewall spacers are disposed adjacent to the gate electrode stack and over only a portion of the source and drain regions. The portion of the source and drain regions under the sidewall spacers has a height and a width greater than a height and a width of the channel region of the semiconductor body.

In another embodiment, a method of fabricating a semiconductor device includes forming a semiconductor body above a substrate. A gate electrode stack is formed over a portion of the semiconductor body to define a channel region in the semiconductor body under the gate electrode stack and source and drain regions in the semiconductor body on either side of the gate electrode stack. Sidewall spacers are formed adjacent to the gate electrode stack and over only a portion of the source and drain regions. The portion of the source and drain regions under the sidewall spacers has a height and a width greater than a height and a width of the channel region of the semiconductor body.

In another embodiment, a method of fabricating a semiconductor device includes forming a hardmask pattern above a substrate. The hardmask pattern includes a first region of fin forming features, each of a first width. The hardmask pattern also includes a second region of fin forming features, each of a second width approximately equal to the first width. Subsequently, a resist layer is formed and patterned to cover the second region and expose the first region. Subsequently, the fin forming features of the first region are etched to form thinned fin forming features, each of a third width less than the second width. Subsequently, the resist layer is removed. Subsequently, the hardmask pattern is transferred to the substrate to form a first region of fins, each of the third width, and to form a second region of fins, each of the second width. Subsequently, semiconductor devices are formed from the fins of the first and second regions.

In another embodiment, a method of fabricating a semiconductor device includes forming a hardmask pattern above a substrate. The hardmask pattern includes a first region of fin forming features, each of a first width. The hardmask pattern also includes a second region of fin forming features, each of a second width approximately equal to the first width. Subsequently, the hardmask pattern is transferred to the substrate to form a first region of fins, each of the first width, and to form a second region of fins, each of the second width. Subsequently, a resist layer is formed and patterned to cover the second region of fins and to expose the first region of fins. Subsequently, the fins of the first region are etched to form thinned fins, each of a third width less than the second width. Subsequently, the resist layer is removed. Subsequently, semiconductor devices are formed from the fins of the first and second regions.

BRIEF DESCRIPTION OF THE DRAWINGS

FIG. 1A illustrates a plan view of a semiconductor device having a necked semiconductor body, in accordance with an embodiment of the present invention.

FIG. 1B illustrates a cross-sectional view of the semiconductor device of FIG. 1A, as taken along the a-a' axis, in accordance with an embodiment of the present invention.

FIG. 1C illustrates a cross-sectional view of the semiconductor device of FIG. 1A, as taken along the b-b' axis, in accordance with an embodiment of the present invention.

DETAILED DESCRIPTION

Figure 2A:
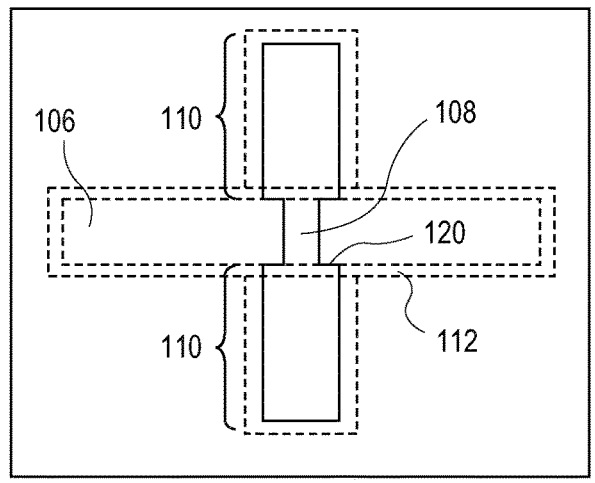
FIG. 2A illustrates a plan view of a semiconductor device having a necked semiconductor body, in accordance with an embodiment of the present invention.

Semiconductor devices having necked semiconductor bodies and methods of forming semiconductor bodies of varying width are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are targeted at semiconductor devices having (1) a different fin width in an active channel region versus fin width underneath a spacer, (2) an integrated circuit with at least two different fin widths in different active channels on the same die, (3) a patterning process to define two different fin widths prior to actual fin etch, (4) a patterning process to define two different fin widths after a sacrificial dummy gate removal process, or combinations thereof. One or more embodiments are targeted at improving the drive current of devices such as transistors and to build circuits that have low idle power and high active performance.

The width of a fin in a FinFET impacts the threshold voltage (Vt) and the external resistance of the device. For high performance devices it may be beneficial to have a relatively wider fin with higher Vt and lower resistance. For low-power devices, the opposite is true. Currently, the process has to be optimized for one of these devices. It may be beneficial to have the best performance for both devices to optimize product power performance. For example, low-power devices are generated with additional well doping leading to higher Vt and higher junction leakage which degrade drive currents, especially at low power supply voltage. Alternatively the process is optimized for low-power devices leading to degraded drive current of the high-performance devices. Embodiments of the present invention may enable the simultaneous optimization of high performance and low power devices by either offering two different devices on the same die or by a device that has both low Vt and low external resistance.

In a first aspect, a semiconductor device having a necked semiconductor body and methods of forming a semiconductor device having a necked semiconductor body are provided. Such a transistor structure has a different fin width in the channel and in the fin region underneath the spacer. A necked fin may improve the tradeoff between short channel effect improvement and external resistance as the fin CD is scaled, improving the drive current of the best device.

In an example, FIG. 1A illustrates a plan view of a semiconductor device having a necked semiconductor body, in accordance with an embodiment of the present invention. FIG. 1B illustrates a cross-sectional view of the semiconductor device of FIG. 1A, as taken along the a-a' axis, in accordance with an embodiment of the present invention. FIG. 1C illustrates a cross-sectional view of the semiconductor device of FIG. 1A, as taken along the b-b' axis, in accordance with an embodiment of the present invention.

Referring to FIGS. 1A-1C, a semiconductor device 100 includes a semiconductor body 104 disposed above a substrate 102. A gate electrode stack 106 is disposed over a portion of the semiconductor body 104 to define a channel region 108 in the semiconductor body 104 under the gate electrode stack 106. Source and drain regions 110 are defined in the semiconductor body 104 on either side of the gate electrode stack 106. Sidewall spacers 112 are disposed adjacent to the gate electrode stack 106 and over only a portion of the source and drain regions 110.

Referring to FIGS. 1B and 1C, the portion of the source and drain regions 110 under the sidewall spacers 112 has a height (H2) and a width (W2) greater than a height (H1) and a width (W1) of the channel region 108 of the semiconductor body 104. The heights H1 and H2 are defined as the height of the respective portion of the semiconductor body 104 that is above an isolation layer 114, as depicted in FIGS. 1B and 1C.

Referring to FIG. 1A, in an embodiment, a portion of the source and drain regions 110 not under the sidewall spacers 112 has a height and a width (W3) greater than the height (H2) and the width (W2) of the portion of the source and drain regions 110 under the sidewall spacers 112, e.g., W3>W2. Alternatively, in another embodiment, a portion of the source and drain regions 110 not under the sidewall spacers 112 has a height and a width (W3) approximately the same as the height (H2) and the width (W2) of the portion of the source and drain regions 110 under the sidewall spacers 112, e.g., W3=W2.

In an embodiment, at least a portion of the source and drain regions 110 is an embedded portion of the source and drain regions 110. That is, in forming the source and drain regions 110, a portion of an original semiconductor body 104 is removed and replaced, e.g., by epitaxial growth, with new portions of the semiconductor body 104. For example, in one such embodiment, the embedded portion of the source and drain regions 110 is composed of a semiconductor material different than that of the channel region 108. In one embodiment, the embedded portion does not include the portion of the source and drain regions 110 under the sidewall spacers 112. In another embodiment, the embedded portion includes at least part of, and possibly all of, the portion of the source and drain regions 110 under the sidewall spacers 112.

In an embodiment, referring to FIGS. 1B and 1C, the substrate 102 is a crystalline substrate, and the semiconductor body 104 (e.g., channel region 108 in FIG. 1B and source and drain regions 110 in FIG. 1C) is continuous with the crystalline substrate 102. That is, the semiconductor body 104 is formed from a bulk substrate. In an alternative embodiment (not shown), a dielectric layer is disposed between the semiconductor body and the substrate, and the semiconductor body is discontinuous with the substrate, e.g., as would be the case for a silicon-on-insulator (SOI) substrate.

In an embodiment, the channel region 108 has a height (H1) approximately in the range of 30-50 nanometers and a width (W1) approximately in the range of 10-30 nanometers. In that embodiment, the height (H1) of the channel region 108 is approximately 1-2 nanometers less than the height (H2) of the portion of the source and drain regions 110 under the sidewall spacers 112. Also, the width (W1) of the channel region 108 is approximately 2-4 nanometers less than the width (W2) of the portion of the source and drain regions 110 under the sidewall spacers 112. In an embodiment, the height (H2) of the portion of the source and drain regions 110 under the sidewall spacers 112 is approximately 1-7% greater than the height (H1) of the channel region 108. In that embodiment, the width (W2) of the portion of the source and drain regions 110 under the sidewall spacers 112 is approximately 6-40% greater than the width (W1) of the channel region 108.

Possible embodiments for the semiconductor device 100 in FIGS. 1A-1C are described below. In a first example, FIG. 2A illustrates a plan view of a semiconductor device having a necked semiconductor body, in accordance with an embodiment of the present invention. Referring to FIG. 2A, the channel region 108 is coupled to the portion of the source and drain regions 110 under the sidewall spacers 112 by a step feature 120. The gate electrode stack 106 is depicted as dashed lines to provide transparency for the underlying channel region 108. Also, the option to have a larger size of the portions of the source and drain regions 110 not under the spacers 112 is depicted by long dashes around the source and drain regions 110.

Figure 2B:
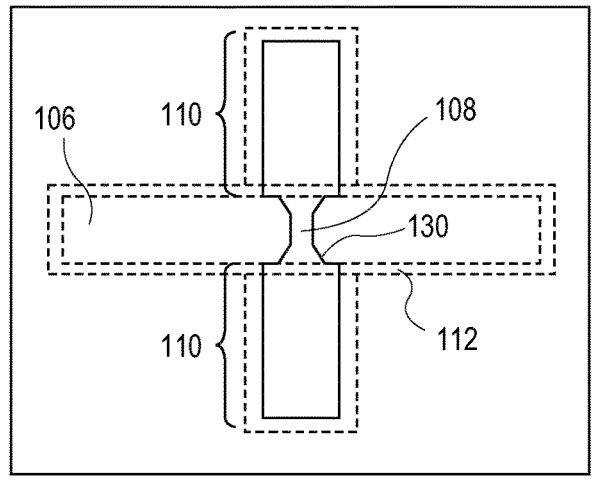
FIG. 2B illustrates a plan view of another semiconductor device having a necked semiconductor body, in accordance with another embodiment of the present invention.

In a second example, FIG. 2B illustrates a plan view of another semiconductor device having a necked semiconductor body, in accordance with another embodiment of the present invention. Referring to FIG. 2B, the channel region 108 is coupled to the portion of the source and drain regions 110 under the sidewall spacers 112 by a facet feature 130. The gate electrode stack 106 is depicted as dashed lines to provide transparency for the underlying channel region 108. Also, the option to have a larger size of the portions of the source and drain regions 110 not under the spacers 112 is depicted by long dashes around the source and drain regions 110.

Figure 2C:
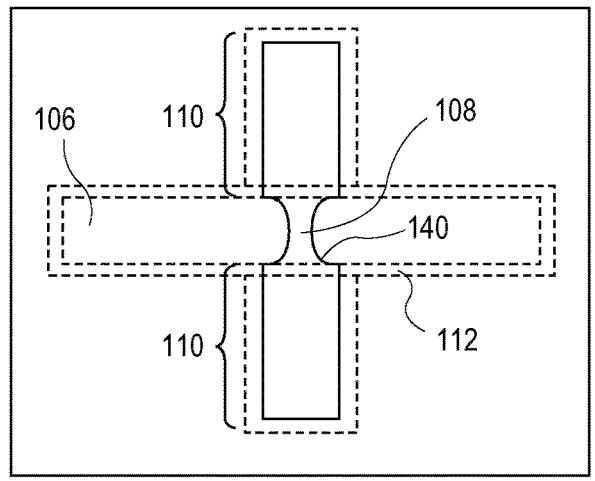
FIG. 2C illustrates a plan view of another semiconductor device having a necked semiconductor body, in accordance with another embodiment of the present invention.

In a third example, FIG. 2C illustrates a plan view of another semiconductor device having a necked semiconductor body, in accordance with another embodiment of the present invention. Referring to FIG. 2C, the channel region 108 is coupled to the portion of the source and drain regions 110 under the sidewall spacers 112 by a rounded corner feature 140. The gate electrode stack 106 is depicted as dashed lines to provide transparency for the underlying channel region 108. Also, the option to have a larger size of the portions of the source and drain regions 110 not under the spacers 112 is depicted by long dashes around the source and drain regions 110.

Thus, referring again to FIGS. 2B and 2C, in an embodiment, the channel region 104 is coupled to the portion of the source and drain regions 110 under the sidewall spacers 112 by a graded feature (e.g., 120 or 140). In an embodiment, the graded feature reduces overlap capacitance and spreading resistance during operating of the semiconductor device 110.

In an embodiment, as described in greater detail below in association with process flows 600 and 700, the semiconductor device 100 is disposed above the same substrate 102 as a second semiconductor device having a channel region. In that embodiment, the narrowest width of the channel region of the second semiconductor device is greater than the narrowest width (e.g., W1) of the channel region 108 of the semiconductor device 100.

Semiconductor device 100 may be any semiconductor device incorporating a gate, a channel region and a pair of source/drain regions. In an embodiment, semiconductor device 100 is one such as, but not limited to, a MOS-FET or a Microelectromechanical System (MEMS). In one embodiment, semiconductor device 100 is a three-dimensional MOS-FET and is an isolated device or is one device in a plurality of nested devices. As will be appreciated for a typical integrated circuit, both N- and P-channel transistors may be fabricated on a single substrate to form a CMOS integrated circuit.

Substrate 102 and, hence, semiconductor body 104 may be composed of a semiconductor material that can withstand a manufacturing process and in which charge can migrate. In an embodiment, the substrate 102 is a bulk substrate, and the semiconductor body 104 is continuous with the bulk substrate 102. In an embodiment, substrate 102 is composed of a crystalline silicon, silicon/germanium or germanium layer doped with a charge carrier, such as but not limited to phosphorus, arsenic, boron or a combination thereof. In one embodiment, the concentration of silicon atoms in substrate 102 is greater than 97% or, alternatively, the concentration of dopant atoms is less than 1%. In another embodiment, substrate 102 is composed of an epitaxial layer grown atop a distinct crystalline substrate, e.g. a silicon epitaxial layer grown atop a boron-doped bulk silicon mono-crystalline substrate. Substrate 102 may also include an insulating layer disposed in between a bulk crystal substrate and an epitaxial layer to form, for example, a silicon-on-insulator substrate. In such an example, the semiconductor body 104 may be an isolated semiconductor body. In an embodiment, the insulating layer is composed of a material such as, but not limited to, silicon dioxide, silicon nitride, silicon oxy-nitride or a high-k dielectric layer. Substrate 102 may alternatively be composed of a group III-V material. In an embodiment, substrate 102 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. Semiconductor body 104 may be composed of multiple semiconductor materials, each of which may include additional doping atoms. In one embodiment, substrate 102 is composed of crystalline silicon and the charge-carrier dopant impurity atoms are one such as, but not limited to, boron, arsenic, indium or phosphorus. In another embodiment, substrate 102 is composed of a III-V material and the charge-carrier dopant impurity atoms are ones such as, but not limited to, carbon, silicon, germanium, oxygen, sulfur, selenium or tellurium. In another embodiment, the semiconductor body 104 is undoped or only lightly doped. Additionally, halo doping, often used in conventional device fabrication, may in one embodiment be eliminated in the fabrication of semiconductor device 100. It is to be understood that, in an embodiment, the material of the semiconductor body 104 is different from the material of the substrate 102.

In another embodiment, the semiconductor device 100 is a non-planar device such as, but not limited to, a fin-FET or a tri-gate device. In such an embodiment, the semiconductor body 104 is composed of or is formed from a three-dimensional body. In one such embodiment, the gate electrode stack 106 surrounds at least a top surface and a pair of sidewalls of the three-dimensional body. In another embodiment, the semiconductor body 104 is made to be a discrete three-dimensional body, such as in a nanowire device. In one such embodiment, the gate electrode stack 106 completely surrounds a portion of the semiconductor body 104.

Gate electrode stack 106 may include a gate electrode and an underlying gate dielectric layer. In an embodiment, the gate electrode of gate electrode stack 106 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the semiconductor body 104. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode is composed of a P-type material. In another embodiment, the gate electrode is composed of an N-type material. In another embodiment, the gate electrode is composed of a mid-gap material. In a specific such embodiment, the corresponding channel region is undoped or is only lightly doped.

In an embodiment, the sidewall spacers 112 are composed of an insulative dielectric material such as, but not limited to, silicon dioxide, silicon carbide, silicon oxy-nitride or silicon nitride. Likewise, the dielectric layer 114 may be composed of an insulative dielectric material such as, but not limited to, silicon dioxide, silicon carbide, silicon oxy-nitride or silicon nitride.

Figure 3:
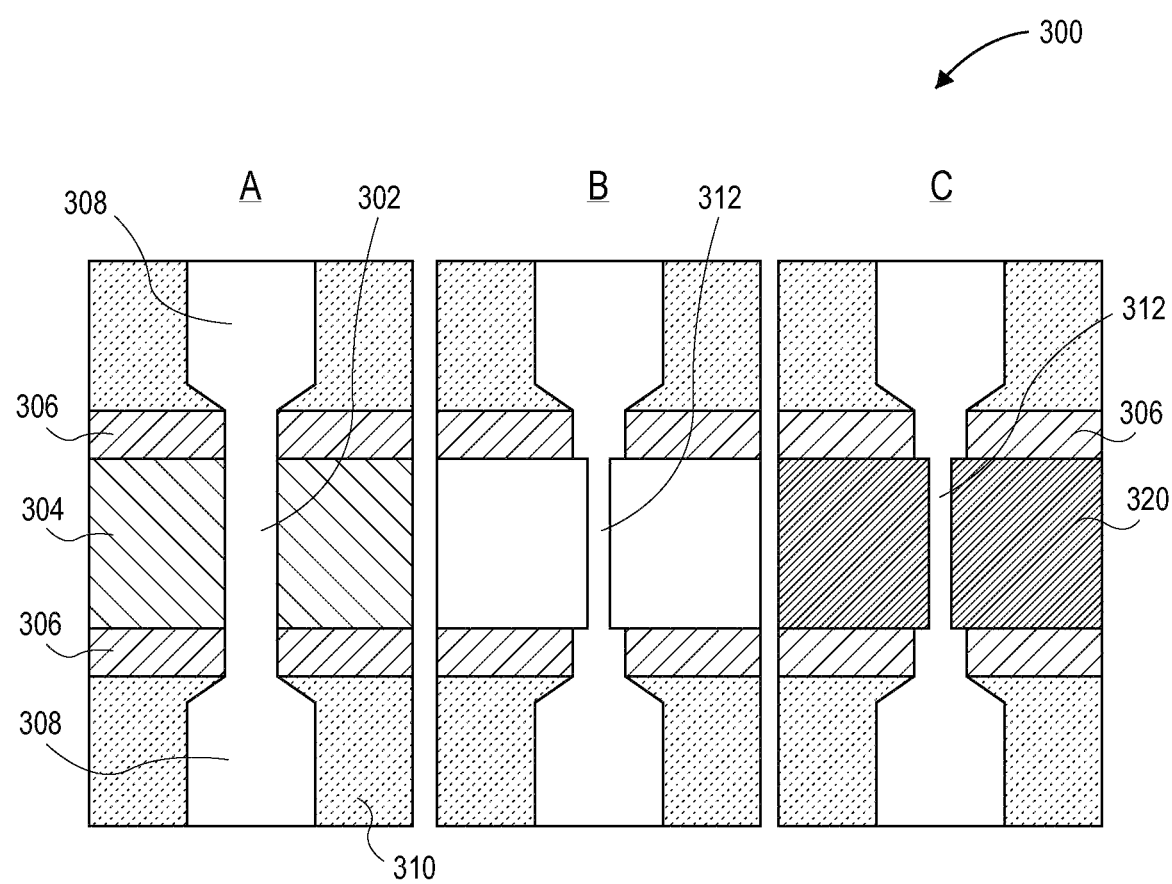
FIG. 3 illustrates a process flow in a method of fabricating a semiconductor device having a necked semiconductor body, in accordance with an embodiment of the present invention.

Methods of forming devices such as those described above are also contemplated within the spirit and scope of embodiments of the present invention. In a first example, FIG. 3 illustrates a process flow 300 in a method of fabricating a semiconductor device having a necked semiconductor body, in accordance with an embodiment of the present invention.

Referring to part A of process flow 300, a thick fin 302 is formed, a sacrificial gate 304 is patterned, gate spacers 306 are formed by blanket deposition and subsequent etching, and source-drain regions 308 are formed. Additionally, an interlayer-dielectric film 310 may be deposited and polished to expose the sacrificial gate 304. Referring to part B of process flow 300, the sacrificial gate 304 is removed and the thick fin 302 is etched to form a thinned fin 312 with a reduced thickness, e.g., reduced by an amount approximately in the range of 1-5 nanometers. Referring to part C of process flow 300, a permanent gate stack 320 is formed over the thinned fin 312. For example, a high-k gate dielectric layer and a metal gate electrode may be formed. In an embodiment, the thinned fin 312 provides improved short channel effects, while the wider portion of the source and drain regions 308 under the spacers 306 aid in reducing external resistance.

The sacrificial gate 304 is, in an embodiment, composed of a material suitable for removal at the replacement gate operation. In one embodiment, sacrificial gate 304 is composed of polycrystalline silicon, amorphous silicon, silicon dioxide, silicon nitride, or a combination thereof. In another embodiment, a protective capping layer (not shown), such as a silicon dioxide or silicon nitride layer, is formed above sacrificial gate 304 is. In an embodiment, an underlying dummy gate dielectric layer (also not shown) is included. In an embodiment, sacrificial gate 304 is includes the sidewall spacers 306, which may be composed of a material suitable to ultimately electrically isolate a permanent gate structure from adjacent conductive contacts. For example, in one embodiment, the spacers 306 are composed of a dielectric material such as, but not limited to, silicon dioxide, silicon oxy-nitride, silicon nitride, or carbon-doped silicon nitride.

In an embodiment, sacrificial gate 304 is removed by a dry etch or wet etch process. In one embodiment, sacrificial gate 304 is composed of polycrystalline silicon or amorphous silicon and is removed with a dry etch process using $SF_6$. In another embodiment, sacrificial gate 304 is composed of polycrystalline silicon or amorphous silicon and are removed with a wet etch process using aqueous $NH_4OH$ or tetramethylammonium hydroxide. In one embodiment, sacrificial gate 304 is composed of silicon nitride and are removed with a wet etch using aqueous phosphoric acid.

The fin 302 may be thinned to form 312 by any suitable technique that removes a portion of fin 302 without detrimentally impacting other semiconductor features that are present, such as by using a dry etch or a wet etch process. In one embodiment, fin 302 is thinned to form 312 by using a dry plasma etch using $NF_3$, HBr, $SF_6/Cl$ or $Cl_2$. In another embodiment, wet etch process is used.

Figure 4:
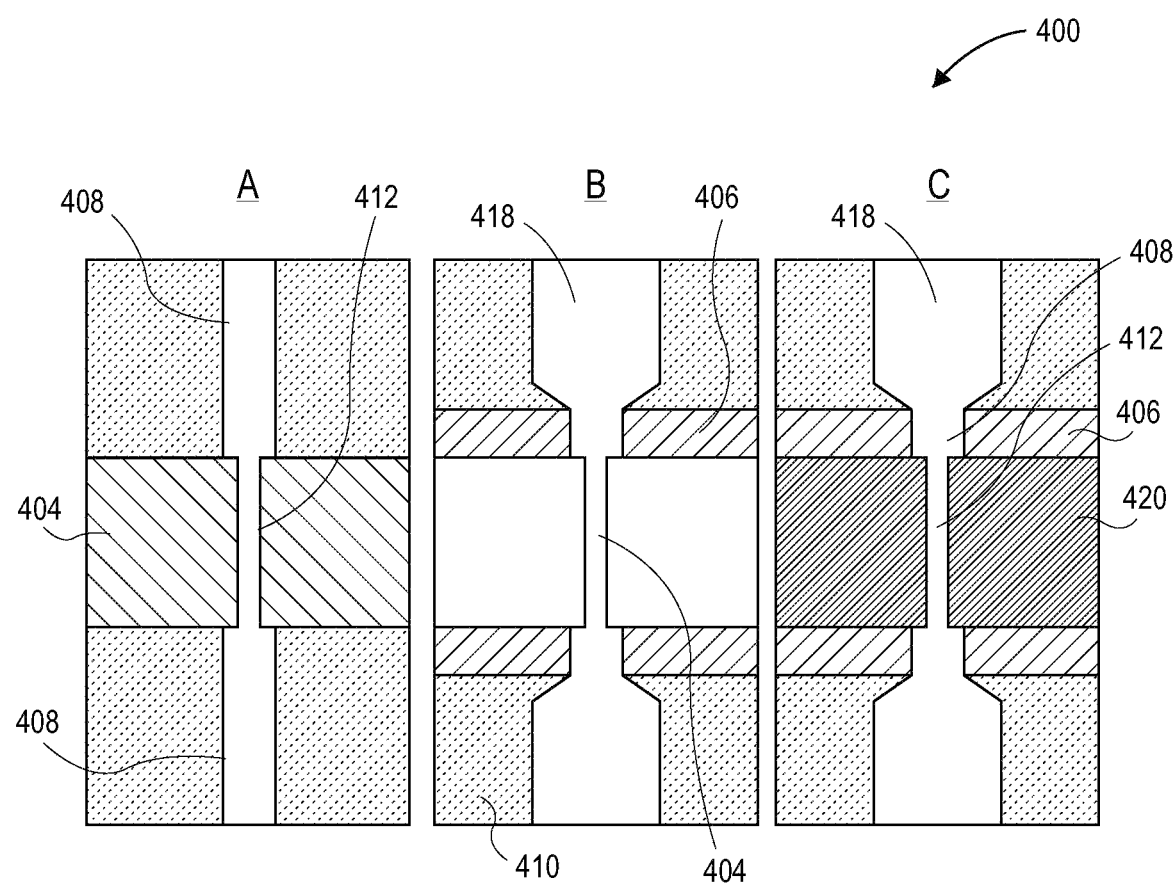
FIG. 4 illustrates a process flow in a method of fabricating a semiconductor device having a necked semiconductor body, in accordance with an embodiment of the present invention.

In a second example, FIG. 4 illustrates a process flow 400 in a method of fabricating a semiconductor device having a necked semiconductor body, in accordance with an embodiment of the present invention. Referring to part A of process flow 400, a thin fin 412 is formed, a sacrificial gate 404 is patterned, and thin source-drain regions 408 are formed. Referring to part B of process flow 400, gate spacers 406 are formed by blanket deposition and subsequent etching, and thick source and drain regions 418 are formed, e.g., by epitaxial growth. Additionally, an interlayer-dielectric film 410 may be deposited and polished to expose the sacrificial gate 404. The sacrificial gate 404 is then removed, as depicted in part B. Referring to part C of process flow 400, a permanent gate stack 420 is formed over the thin fin 412. For example, a high-k gate dielectric layer and a metal gate electrode may be formed. In an embodiment, the thin fin 412 provides improved short channel effects, while the wider portion of the source and drain regions 408/418 under the spacers 406 aid in reducing external resistance. Sacrificial gate formation and replacement may be performed as described above in association with process flow 300.

Thus, in an embodiment, a method of fabricating a semiconductor device includes forming a semiconductor body above a substrate. A gate electrode stack is formed over a portion of the semiconductor body to define a channel region in the semiconductor body under the gate electrode stack and source and drain regions in the semiconductor body on either side of the gate electrode stack. Sidewall spacers are formed adjacent to the gate electrode stack and over only a portion of the source and drain regions. The portion of the source and drain regions under the sidewall spacers has a height and a width greater than a height and a width of the channel region of the semiconductor body.

In one such embodiment, forming the gate electrode stack includes forming a sacrificial gate electrode stack, removing the sacrificial gate electrode stack, and forming a permanent gate electrode stack. In that embodiment, forming the channel region includes thinning a portion of the semiconductor body exposed subsequent to removing the sacrificial gate electrode stack and prior to forming the permanent gate electrode stack, e.g., as described in association with process flow 300. In another such embodiment, forming the gate electrode stack includes forming a sacrificial gate electrode stack, removing the sacrificial gate electrode stack, and forming a permanent gate electrode stack. In that embodiment, forming the source and drain regions includes expanding a portion of the semiconductor body exposed prior to removing the sacrificial gate electrode stack, e.g., as described in association with process flow 400.

Figure 5A:
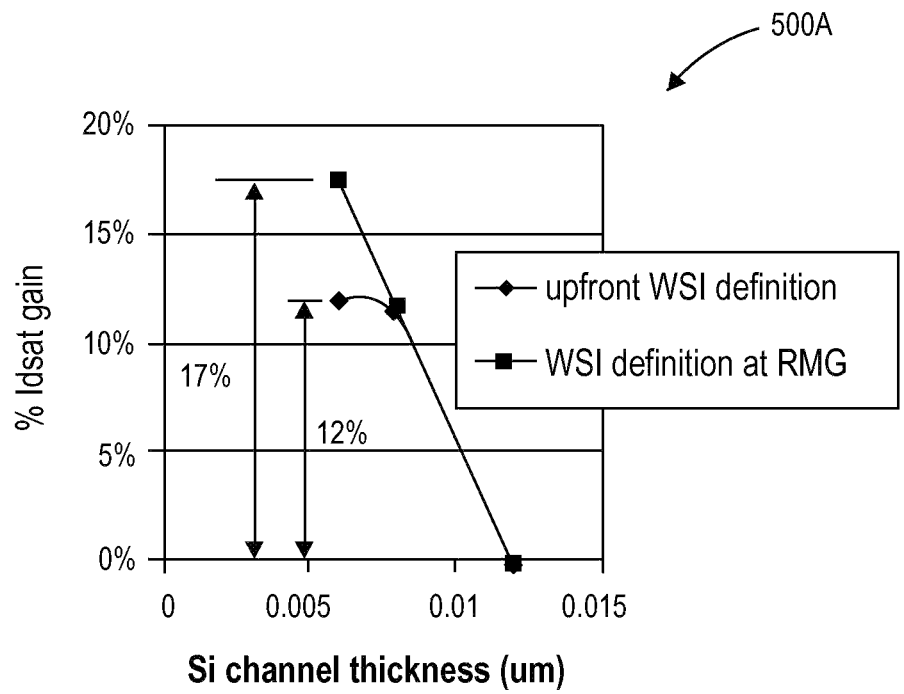
FIG. 5A includes a plot of drive current gain (as % Idsat gain) as a function of silicon channel thickness (in microns) of a semiconductor device having a necked semiconductor body versus a semiconductor device without a necked semiconductor body, in accordance with an embodiment of the present invention.
Figure 5B:
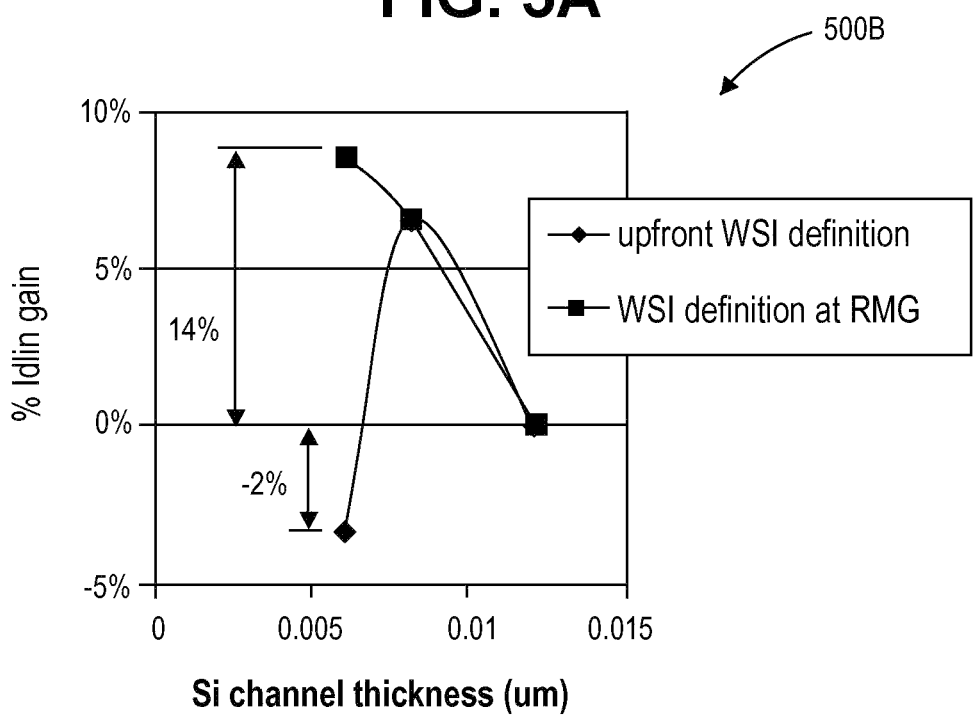
FIG. 5B includes a plot of drive current gain (as % Idlin gain) as a function of silicon channel thickness (in microns) of a semiconductor device having a necked semiconductor body versus a semiconductor device without a necked semiconductor body, in accordance with an embodiment of the present invention.

FIG. 5A includes a plot 500A of drive current gain (as % Idsat gain) as a function of silicon channel thickness (in microns) of a semiconductor device having a necked semiconductor body versus a semiconductor device without a necked semiconductor body, in accordance with an embodiment of the present invention. FIG. 5B includes a plot 500B of drive current gain (as % Idlin gain) as a function of silicon channel thickness (in microns) of a semiconductor device having a necked semiconductor body versus a semiconductor device without a necked semiconductor body, in accordance with an embodiment of the present invention. Referring to plots 500A and 500B, a fin formed by up front silicon width (Wsi) definition is compared against a fin with thinned silicon width (Wsi) as defined during a replacement gate operation, e.g., as described in association with process flow 300. The plots reveal the expected drive current gain for the thinned fin device.

In a second aspect, methods of forming semiconductor bodies of varying width are provided. Such a process may enable formation of different fin widths within the same die. Using wider fin width devices for high performance application and lower fin width devices for low power (low standby leakage) applications may thus be achieved on the same die.

Figure 6:
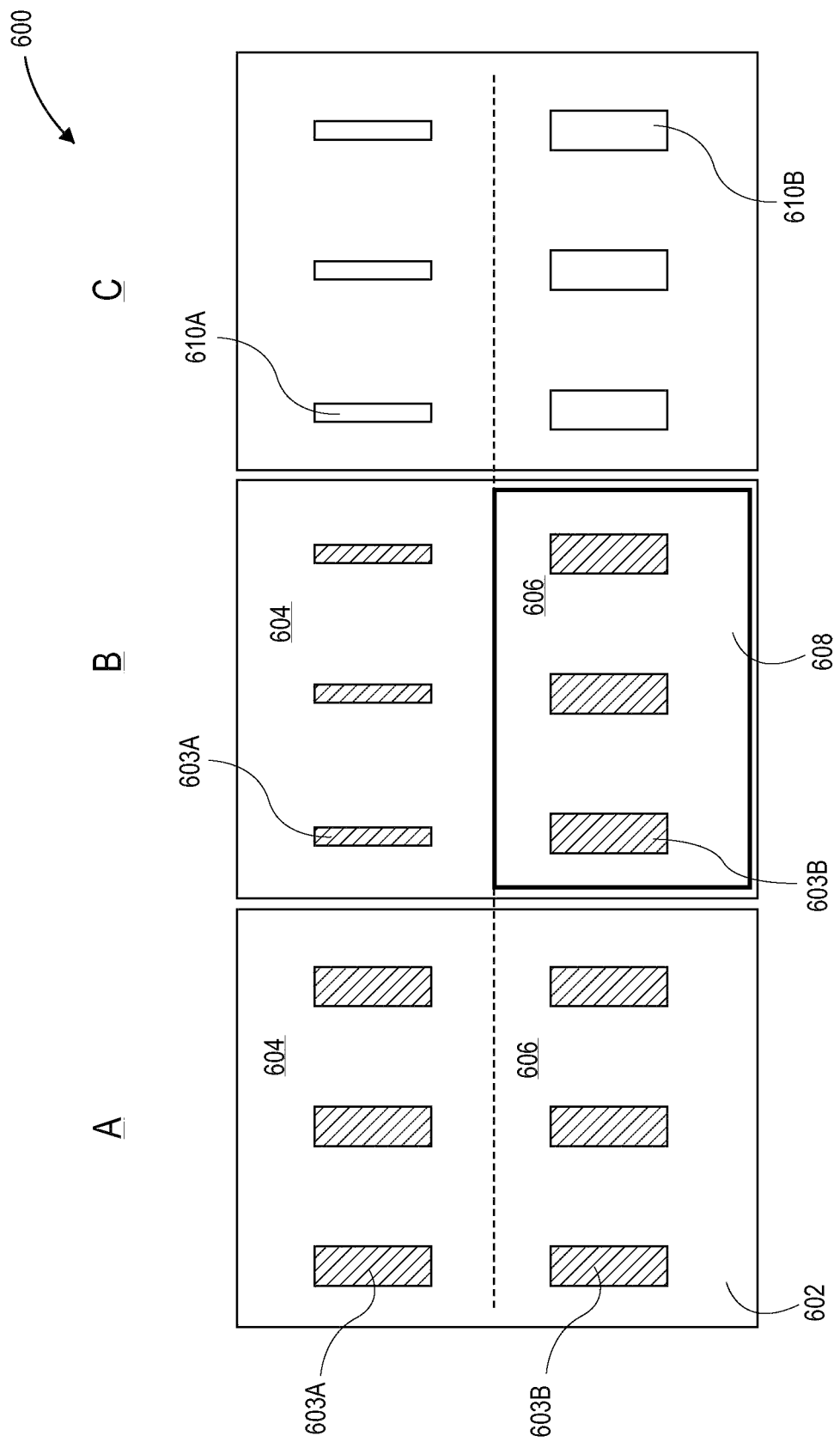
FIG. 6 illustrates a process flow in a method of fabricating semiconductor devices having with semiconductor bodies of varying width, in accordance with an embodiment of the present invention.

In a first example, FIG. 6 illustrates a process flow 600 in a method of fabricating semiconductor devices having with semiconductor bodies of varying width, in accordance with an embodiment of the present invention.

Referring to part A of process flow 600, hardmask 603A/603B formation above a substrate 602, e.g., above a crystalline silicon substrate, for ultimate fin formation includes deposition and patterning of a hardmask layer. The patterned hardmask layer 603A/603B includes regions 604 for ultimate thin fin formation and region 606 for ultimate thick fin formation. Referring to part B of process flow 600, the fins that will remain wider (e.g., in region 606) are blocked with resist layer 608 and the exposed hardmask 603A is etched to reduce the width of the lines. Referring to part C of process flow 600, the resist layer 608 is then removed, e.g. including an ash process, and the new hardmask pattern 603A/603B is transferred into the substrate 602 to form the fins 610A and 610B. Alternatively, in an embodiment, the additional lithography fin thinning may be performed after the fins are etched into the substrate and prior to patterning of a sacrificial gate. In an embodiment, hardmask regions 603A/603B are first formed by a spacer patterning flow, which may be used to effectively double the pitch of the lithographic process used to form the features. Process flow 600 preserves the pitch of the spacer patterning flow.

Thus, in an embodiment, a method of fabricating a semiconductor device includes forming a hardmask pattern above a substrate. The hardmask pattern includes a first region of fin forming features, each of a first width. The hardmask pattern also includes a second region of fin forming features, each of a second width approximately equal to the first width. Subsequently, a resist layer is formed and patterned to cover the second region and expose the first region. Subsequently, the fin forming features of the first region are etched to form thinned fin forming features, each of a third width less than the second width. Subsequently, the resist layer is removed. Subsequently, the hardmask pattern is transferred to the substrate to form a first region of fins, each of the third width, and to form a second region of fins, each of the second width. Subsequently, semiconductor devices are formed from the fins of the first and second regions. In one such embodiment, the substrate is a single-crystalline silicon substrate, and transferring the hardmask pattern to the substrate includes forming single crystalline silicon fins.

Figure 7:
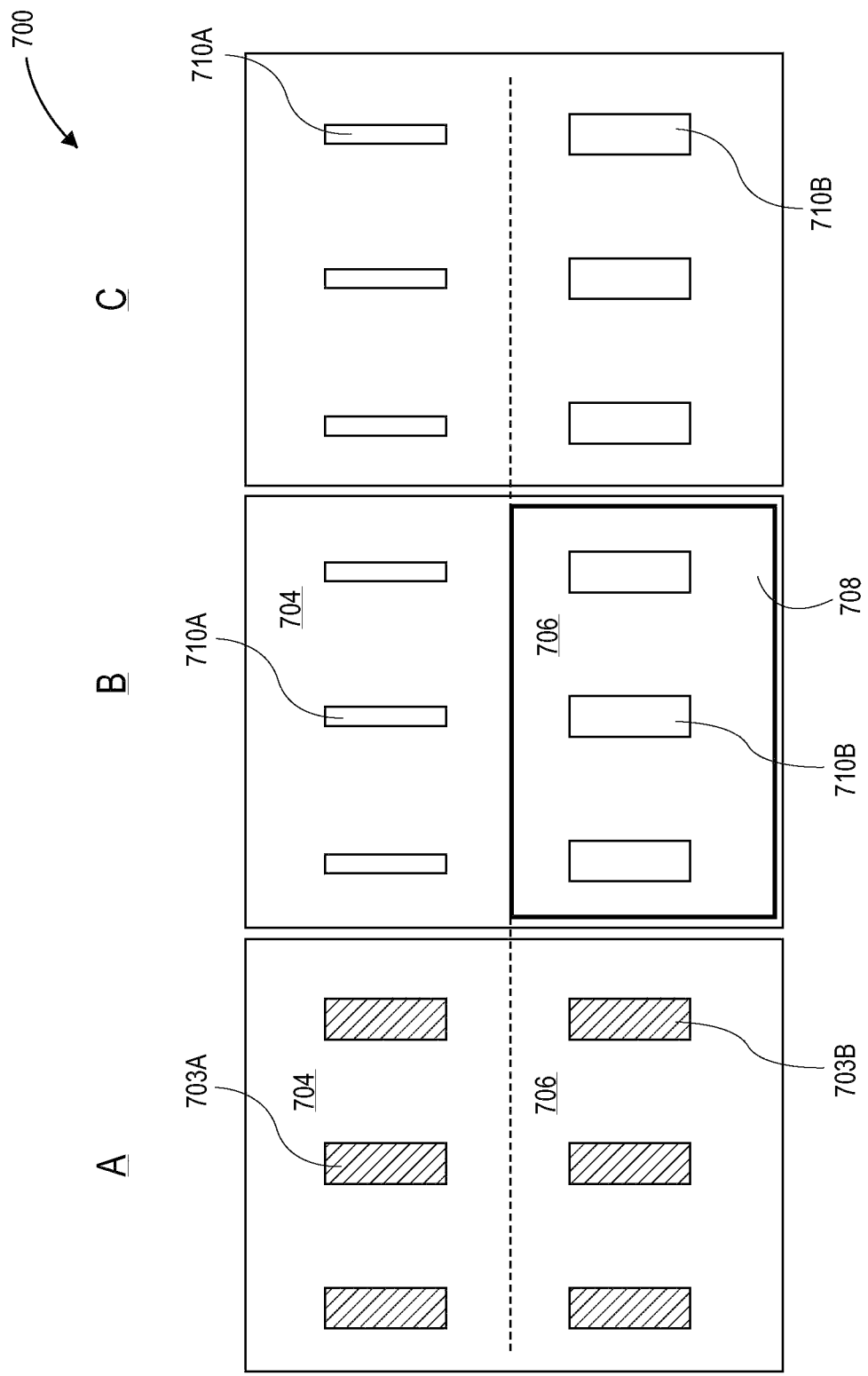
FIG. 7 illustrates a process flow in a method of fabricating semiconductor devices having with semiconductor bodies of varying width, in accordance with an embodiment of the present invention.

In a second example, FIG. 7 illustrates a process flow 700 in a method of fabricating semiconductor devices having with semiconductor bodies of varying width, in accordance with an embodiment of the present invention.

Referring to part A of process flow 700, hardmask 703A/703B formation above a substrate 702, e.g., above a crystalline silicon substrate, for fin formation includes deposition and patterning of a hardmask layer. The patterned hardmask layer 703A/703B includes regions 704 for thin fin formation and region 706 for thick fin formation. The hardmask pattern 703A/703B is the transferred into the substrate 702 to form corresponding fins. Sacrificial gate patterning and extension source and drain formation may then be performed. Also, an inter-layer dielectric material may be deposited and the polished to reveal the sacrificial gates. The sacrificial gates are then removed. Referring to part B of process flow 700, the fins 710B that will remain wider (e.g., in region 706) are blocked with resist layer 708. A fin thinning etch is used to reduce the fin width of the fins 710A. Referring to part C of process flow 700, the resist layer 708 is removed, e.g. including an ash process, and standard device fabrication techniques may be performed using thinner fins 710A and wider fins 710B. In an embodiment, hardmask regions 703A/703B are first formed by a spacer patterning flow, which may be used to effectively double the pitch of the lithographic process used to form the features. Process flow 700 preserves the pitch of the spacer patterning flow.

Thus, in an embodiment, a method of fabricating a semiconductor device includes forming a hardmask pattern above a substrate. The hardmask pattern includes a first region of fin forming features, each of a first width. The hardmask pattern also includes a second region of fin forming features, each of a second width approximately equal to the first width. Subsequently, the hardmask pattern is transferred to the substrate to form a first region of fins, each of the first width, and to form a second region of fins, each of the second width. Subsequently, a resist layer is formed and patterned to cover the second region of fins and to expose the first region of fins. Subsequently, the fins of the first region are etched to form thinned fins, each of a third width less than the second width. Subsequently, the resist layer is removed. Subsequently, semiconductor devices are formed from the fins of the first and second regions. In one such embodiment, the substrate is a single-crystalline silicon substrate, and transferring the hardmask pattern to the substrate includes forming single crystalline silicon fins.

The processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET.

Figure 8:
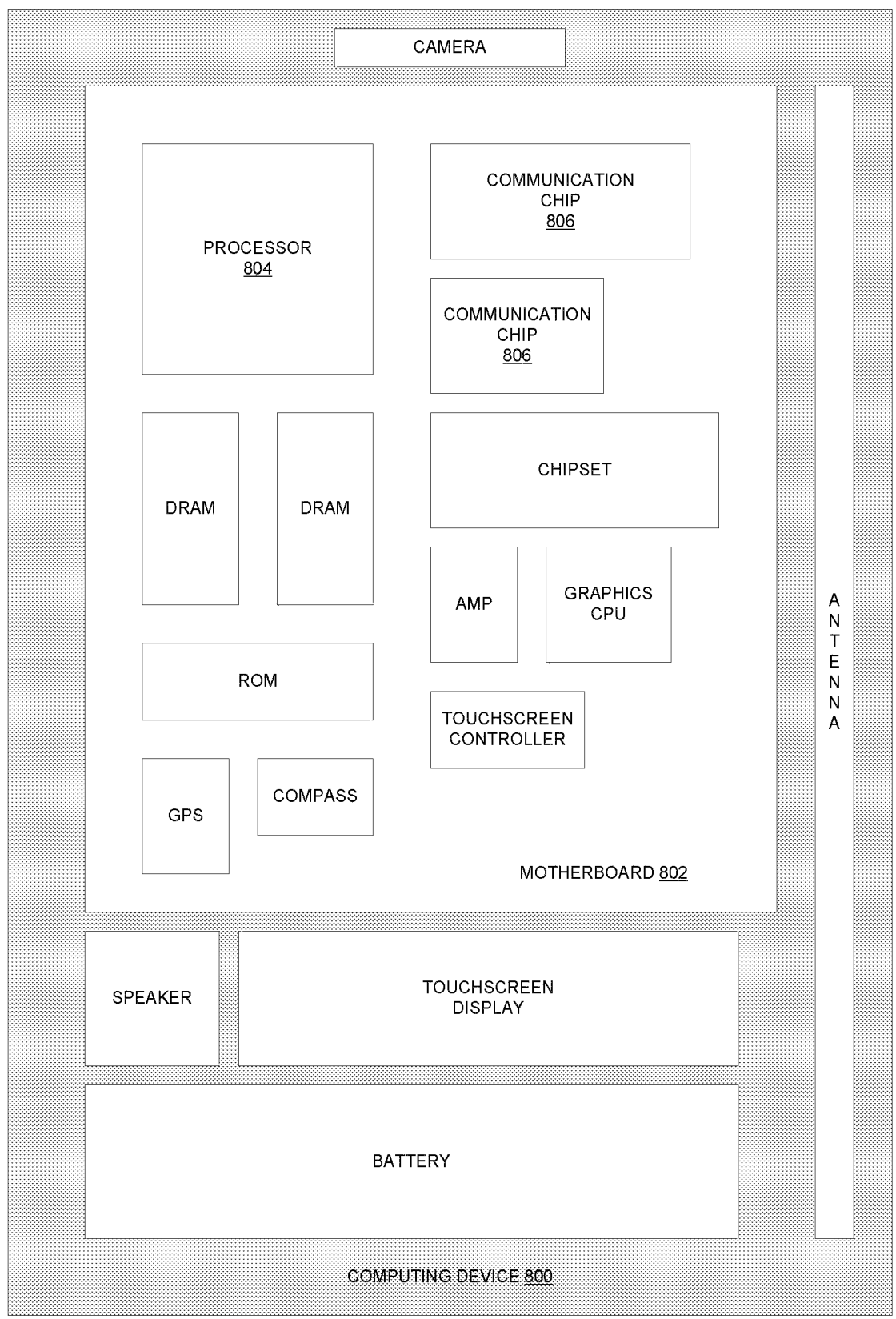
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, semiconductor devices having necked semiconductor bodies and methods of forming semiconductor bodies of varying width have been disclosed. In an embodiment, a semiconductor device includes a semiconductor body disposed above a substrate. A gate electrode stack is disposed over a portion of the semiconductor body to define a channel region in the semiconductor body under the gate electrode stack. Source and drain regions are defined in the semiconductor body on either side of the gate electrode stack. Sidewall spacers are disposed adjacent to the gate electrode stack and over only a portion of the source and drain regions. The portion of the source and drain regions under the sidewall spacers has a height and a width greater than a height and a width of the channel region of the semiconductor body. In one embodiment, the semiconductor device is disposed above the same substrate as a second semiconductor device having a channel region, and the narrowest width of the channel region of the second semiconductor device is greater than the narrowest width of the channel region of the semiconductor device.

What is claimed is:

1. A semiconductor device, comprising:
   a semiconductor body disposed above a substrate;
   a gate electrode stack disposed over a portion of the semiconductor body to define a channel region in the semiconductor body under the gate electrode stack and source and drain regions in the semiconductor body on either side of the gate electrode stack; and
   sidewall spacers disposed adjacent to the gate electrode stack and over only a portion of the source and drain regions, wherein the portion of the source and drain regions under the sidewall spacers has a width where the portion of the source and drain regions under the sidewall spacers meets the channel region, the width greater than a width of the channel region of the semiconductor body.

2. The semiconductor device of claim 1, wherein a portion of the source and drain regions not under the sidewall spacers has a width greater than the width of the portion of the source and drain regions under the sidewall spacers.

3. The semiconductor device of claim 1, wherein a portion of the source and drain regions not under the sidewall spacers has a width approximately the same as the width of the portion of the source and drain regions under the sidewall spacers.

4. The semiconductor device of claim 1, wherein at least a portion of the source and drain regions is an embedded epitaxial portion of the source and drain regions.

5. The semiconductor device of claim 4, wherein the embedded epitaxial portion of the source and drain regions comprise a semiconductor material different than the channel region.

6. The semiconductor device of claim 1, wherein the substrate is a crystalline substrate, and the semiconductor body is continuous with the crystalline substrate.

7. The semiconductor device of claim 1, wherein a dielectric layer is disposed between the semiconductor body and the substrate, and the semiconductor body is discontinuous with the substrate.

8. The semiconductor device of claim 1, wherein the channel region has a width approximately in the range of 10-30 nanometers, and the width of the channel region is approximately 2-4 nanometers less than the width of the portion of the source and drain regions under the sidewall spacers.

9. The semiconductor device of claim 1, wherein the width of the portion of the source and drain regions under the sidewall spacers is approximately 6-40% greater than the width of the channel region.

10. The semiconductor device of claim 1, wherein the channel region is coupled to the portion of the source and drain regions under the sidewall spacers by a step feature.

11. The semiconductor device of claim 1, wherein the channel region is coupled to the portion of the source and drain regions under the sidewall spacers by a graded feature.

12. The semiconductor device of claim 11, wherein the graded feature comprises a facet.

13. The semiconductor device of claim 11, wherein the graded feature comprises a rounded corner.

14. The semiconductor device of claim 11, wherein the graded feature reduces overlap capacitance and spreading resistance during operating of the semiconductor device.

15. The semiconductor device of claim 1, wherein the semiconductor device is disposed above the same substrate as a second semiconductor device having a channel region, and wherein the narrowest width of the channel region of the second semiconductor device is greater than the narrowest width of the channel region of the semiconductor device.

16. A computing device, comprising:
    a board; and
    a component coupled to the board, the component including an integrated circuit structure, comprising:
      a semiconductor body disposed above a substrate;
      a gate electrode stack disposed over a portion of the semiconductor body to define a channel region in the semiconductor body under the gate electrode stack and source and drain regions in the semiconductor body on either side of the gate electrode stack; and
      sidewall spacers disposed adjacent to the gate electrode stack and over only a portion of the source and drain regions, wherein the portion of the source and drain regions under the sidewall spacers has a width where the portion of the source and drain regions under the sidewall spacers meets the channel region, the width greater than a width of the channel region of the semiconductor body.

17. The computing device of claim 16, further comprising:
    a memory coupled to the board.

18. The computing device of claim 16, further comprising:
    a communication chip coupled to the board.

19. The computing device of claim 16, wherein the component is a packaged integrated circuit die.

20. The computing device of claim 16, wherein the computing device is selected from the group consisting of a mobile phone, a laptop, a desk top computer, a server, and a set-top box.

21. A semiconductor device, comprising:
    a semiconductor body disposed above a substrate;
    a gate electrode stack disposed over a portion of the semiconductor body to define a channel region in the semiconductor body under the gate electrode stack and source and drain regions in the semiconductor body on either side of the gate electrode stack; and
    sidewall spacers disposed adjacent to the gate electrode stack and over only a portion of the source and drain regions, wherein the portion of the source and drain regions under the sidewall spacers has a width greater than a width of the channel region of the semiconductor body, wherein the channel region has a width approximately in the range of 10-30 nanometers, and the width of the channel region is approximately 2-4 nanometers less than the width of the portion of the source and drain regions under the sidewall spacers.

22. A semiconductor device, comprising:
    a semiconductor body disposed above a substrate;
    a gate electrode stack disposed over a portion of the semiconductor body to define a channel region in the semiconductor body under the gate electrode stack and source and drain regions in the semiconductor body on either side of the gate electrode stack; and
    sidewall spacers disposed adjacent to the gate electrode stack and over only a portion of the source and drain regions, wherein the portion of the source and drain regions under the sidewall spacers has a width greater than a width of the channel region of the semiconductor body, wherein the channel region is coupled to the portion of the source and drain regions under the sidewall spacers by a step feature.

23. A semiconductor device, comprising:
a semiconductor body disposed above a substrate;
a gate electrode stack disposed over a portion of the semiconductor body to define a channel region in the semiconductor body under the gate electrode stack and source and drain regions in the semiconductor body on either side of the gate electrode stack; and
sidewall spacers disposed adjacent to the gate electrode stack and over only a portion of the source and drain regions, wherein the portion of the source and drain regions under the sidewall spacers has a width greater than a width of the channel region of the semiconductor body, wherein the channel region is coupled to the portion of the source and drain regions under the sidewall spacers by a graded feature, and wherein the graded feature comprises a facet.

24. A semiconductor device, comprising:
a semiconductor body disposed above a substrate;
a gate electrode stack disposed over a portion of the semiconductor body to define a channel region in the semiconductor body under the gate electrode stack and source and drain regions in the semiconductor body on either side of the gate electrode stack; and
sidewall spacers disposed adjacent to the gate electrode stack and over only a portion of the source and drain regions, wherein the portion of the source and drain regions under the sidewall spacers has a width greater than a width of the channel region of the semiconductor body, wherein the semiconductor device is disposed above the same substrate as a second semiconductor device having a channel region, and wherein the narrowest width of the channel region of the second semiconductor device is greater than the narrowest width of the channel region of the semiconductor device.

* * * * *